United States Patent
Korzenski et al.

(10) Patent No.: US 7,119,052 B2
(45) Date of Patent: Oct. 10, 2006

(54) COMPOSITIONS AND METHODS FOR HIGH-EFFICIENCY CLEANING/POLISHING OF SEMICONDUCTOR WAFERS

(75) Inventors: Michael B. Korzenski, Danbury, CT (US); Chongying Xu, New Milford, CT (US); Thomas H. Baum, New Fairfield, CT (US); David Minsek, Pleasantville, NY (US); Eliodor G. Ghenciu, King of Prussia, PA (US)

(73) Assignee: Advanced Technology Materials, Inc., Danbury, CT (US)

( * ) Notice: Subject to any disclaimer, the term of this patent is extended or adjusted under 35 U.S.C. 154(b) by 276 days.

(21) Appl. No.: 10/602,172

(22) Filed: Jun. 24, 2003

(65) Prior Publication Data
US 2004/0266635 A1    Dec. 30, 2004

(51) Int. Cl.
*B01D 11/00*    (2006.01)
*G03F 7/42*    (2006.01)
(52) U.S. Cl. ............ 510/175; 510/176; 510/255; 438/906; 134/36; 134/902; 134/34
(58) Field of Classification Search ........... 510/175, 510/176, 177; 134/1.3, 2, 3, 22.12, 1, 902; 438/692, 745
See application file for complete search history.

(56) References Cited

U.S. PATENT DOCUMENTS

| | | | | |
|---|---|---|---|---|
| 5,944,996 A | * | 8/1999 | DeSimone et al. | 210/634 |
| 6,306,564 B1 | * | 10/2001 | Mullee | 430/329 |
| 6,521,466 B1 | * | 2/2003 | Castrucci | 438/5 |
| 6,743,078 B1 | * | 6/2004 | McClain et al. | 451/41 |
| 6,871,656 B1 | * | 3/2005 | Mullee | 134/103.1 |

OTHER PUBLICATIONS

Post-Etch Cleaning of 300mm Dual Damascene Low-K Dielectric Structures Using Supercritical CO2, Abs. 796, 204th Meeting 2003 The Electrochemical Society, Inc., Robert B. Turkot, Jr., et al.
Supercritical CO2 Post-Etch Cleaning of a Patterned Porous Low-K Dielectric, Ashland Specialty Chemical Company, D. Peters, et al., pp. 194-201.

* cited by examiner

*Primary Examiner*—Gregory Webb
(74) *Attorney, Agent, or Firm*—Margaret Chappuis; Tristan A. Fuierer; Moore & Van Allen PLLC

(57) ABSTRACT

A composition including supercritical fluid and at least one additive selected from fluoro species, and primary and/or secondary amines, optionally with co-solvent, low k material attack-inhibitor(s) and/or surfactant(s). The composition has particular utility for cleaning of semiconductor wafers to remove post-ashing residues therefrom.

86 Claims, 2 Drawing Sheets

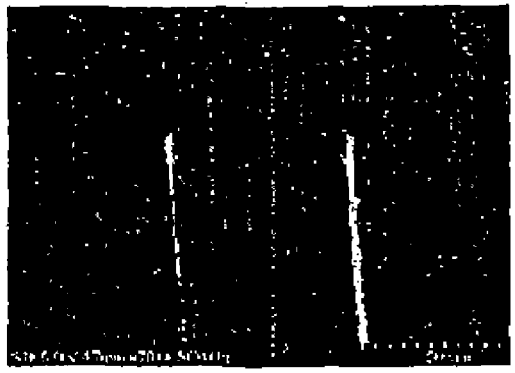 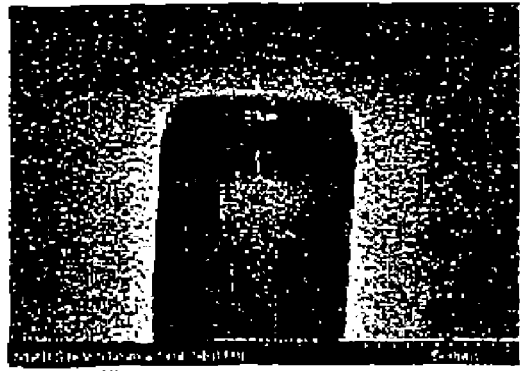
FIG. 3A        FIG. 3B
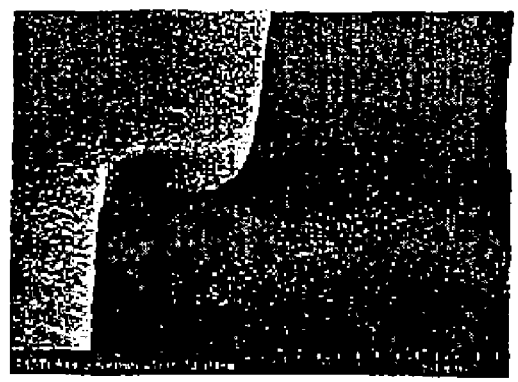
FIG. 4

COMPOSITIONS AND METHODS FOR HIGH-EFFICIENCY CLEANING/POLISHING OF SEMICONDUCTOR WAFERS

FIELD OF THE INVENTION

The present invention relates to compositions and methods for high-efficiency cleaning of semiconductor wafers.

DESCRIPTION OF THE RELATED ART

The fabrication of multi-layer semiconductor circuits requires the deposition of multiple patterned layers of semiconductor, conductor and dielectric materials. Patterning is conventionally carried out by optical imaging of a photoresist layer formed from a composition containing a soluble polymer and a photoactive compound. Following patterning, deposition, and etching, the photoresist layer must be completely removed before the next processing step.

Plasma ashing can remove photoresist but leaves a post-ash residue on the substrate that must be removed. Typically, liquid photoresist or post-ash residue removers are employed. Such removers, however, generate a large amount of hazardous waste that is harmful to the environment, and costly to dispose of, or treat.

The art therefore has a continuing and critical need for improved compositions for cleaning of residues, e.g., post-ashing residues, from semiconductor wafers (such term herein including wafer base or substrate articles per se, as well as such articles having material deposited thereon or therein to form semiconductor devices or precursor structures for such devices.

As a further and specific problem attendant the use of conventional liquid-based cleaning and post-etch residue removal compositions, the geometric scale of features in semiconductor device architectures continues to diminish. At critical dimensions (of high aspect ratio vias, deep trenches and other semiconductor device or precursor structure features) below 0.1 µm, the high surface tension that is characteristic of aqueous compositions used to clean wafers prevents the penetration of the composition into the semiconductor wafer features.

Thus, although liquid-based cleaning and post-etch residue removal integrated circuit processes are well-developed and accepted for device manufacturing, their future utility is highly questionable. Apart from problems attendant the high surface tension of aqueous cleaning compositions, copper, porous, low-k multi-layers may require special, non-aqueous cleaning to eliminate aqueous contamination of the pores and consequent reduction of device yields when pore contaminants cannot be removed. Additionally, the dielectric constant of low k materials is critical and aqueous contamination can negatively increase the dielectric constant.

The foregoing highlights the need of the art for improved cleaning compositions and methods for removal of post-etch lithographic resist (polymer) residue, removal of chemical mechanical planarization (CMP) particles in deep-trench, high aspect ratio vias, removal of metal oxides, metal residues and metal contaminants that remain on the wafer after etching, CMP and interconnect processes (e.g., physical vapor deposition (PVD), chemical vapor deposition (CVD) and plating) for metalization.

SUMMARY OF THE INVENTION

The present invention relates to compositions and methods for high-efficiency cleaning of semiconductor wafers.

In one aspect, the invention relates to a composition for cleaning semiconductor wafers, wherein the composition includes a supercritical fluid and at least one additive selected from the group consisting of:
  a. fluoro-species; and
  b. primary and/or secondary amine(s).

Another aspect of the invention relates to a method of cleaning of a semiconductor wafer, wherein the method comprises contacting the semiconductor wafer with a supercritical fluid-based cleaning composition including supercritical fluid and at least one additive selected from the group consisting of:
  a. fluoro-species; and
  b. primary and/or secondary amine(s).

Other aspects, features and embodiments of the invention will be more fully apparent from the ensuing disclosure and appended claims.

BRIEF DESCRIPTION OF THE DRAWINGS

FIGS. 3A and 3B are scanning electron microscope (SEM) micrographs of a post-ashing trench structure in a two-layer coating on a silicon substrate, wherein the two-layer coating includes a first (lower) layer of low k dielectric material and a second (upper) layer of a capping dielectric material, before cleaning.

FIG. 4 is an SEM micrograph of the trench structure of FIG. 1, after washing with a cleaning composition comprising $SCCO_2$, isopropanol, $NH_4F$ and non-ionic surfactant.

DETAILED DESCRIPTION OF THE INVENTION, AND PREFERRED EMBODIMENTS THEREOF

Figure 1:
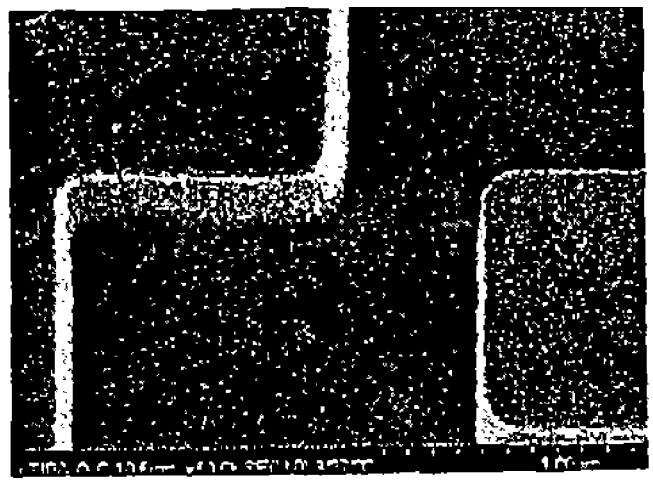
FIG. 1 is a scanning electron microscope (SEM) micrograph of a post-ashing trench structure in a two-layer coating on a silicon substrate, wherein the two-layer coating includes a first (lower) layer of low k dielectric material and a second (upper) layer of a capping dielectric material, before cleaning.

The present invention relates to compositions and methods for high-efficiency cleaning of semiconductor wafers. The compositions include supercritical fluid and at least one additive selected from the group consisting of (I) fluoro-species and (II) primary and/or secondary amine(s). Such compositions optionally further include co-solvent, low k material- attack-inhibitor, and/or surfactant species, as variously employed in specific embodiments of the invention.

In general, the compositions of the invention as variously hereinafter described may alternatively "comprise," "consist" or "consist essentially of" the ingredients specified for such compositions. Additionally, compositions of the invention can further include stabilizers, dispersants, etc., and other ingredients, as appropriate to the formulation and use of such compositions.

In one aspect, the invention provides wafer-cleaning compositions utilizing a supercritical fluid (SCF) in combination with hydrogen fluoride and/or a fluoride ion source.

The invention in such aspect utilizes a supercritical fluid component having the viscosity and diffusivity of a gas, and thereby capable of penetrating quickly into interstices, trenches, high aspect ratio vias, and other finely-dimensioned features of the wafer article. The supercritical fluid comprises a substantial major fraction of the cleaning composition. The cleaning composition also compensates for the polarity of the SCF by inclusion of a component having a polarity that is opposite to that of the SCF. For example, the non-polar character of a $SCCO_2$ component is compensated by incorporation of a hydrogen fluoride (HF) and/or fluoride ion (F) component, hereafter referred to as "fluoro species," so that the SCF's inherently low ability to solubilize polymer and/or post-ash residues is obviated by the presence of the fluoro species, which imparts to the composition the capability to solubilize polar surface residues on the semiconductor wafer, and to increase the etch rates of aqueous as well as non-aqueous solutions.

It is indeed surprising that SCF and fluoro species in combination would be an effective cleaning combination for photoresist and post-ashing residues on the semiconductor wafer, since fluoro species exhibit very low solubilities in SCF media, and since it would be expected that the SCF would be such an effective penetrant as to blanket the wafer surface preferentially and produce only a low level, if any, of polymer and/or post-ashing residue from the wafer surface, so that any removal action caused by chemical (etching) attack on the wafer surface would be negligible or energetically disfavored. This however, has been discovered to not be the case. Contrariwise, the combination of SCF and fluoro species has been demonstrated to be an effective cleaning combination having superior ability to remove polymer resist materials as well as post-ash residues from the wafer surface.

SCF/fluoro species compositions of the invention are readily formulated for use in cleaning of oxides and oxide-containing residues, by subjecting the source fluid for the SCF to pressure and temperature conditions above the critical point where the source fluid becomes a supercritical fluid. Once the source fluid is in the SCF state, the fluoro species and optional other ingredients of the composition are added, e.g., under simple mixing or blending conditions to produce a homogeneous cleaning composition.

Such optional other ingredients include co-solvent media (to enhance the solubility of the fluoro species in the SCF), inhibitors (to prevent or at least minimize attack of the cleaning composition on low k and other susceptible materials on the wafer surface), surfactants (to increase the homogeneity of the composition and the compatibility of its blended components), and other additives, adjuvants and enhancers such as may be useful or desirable in a given cleaning operation.

The SCF used in compositions of the invention can be of any suitable type. Non-limiting examples of SCF species that can be used in the broad practice of the invention include carbon dioxide, oxygen, argon, krypton, xenon, ammonia, methane, methanol, dimethyl ketone, hydrogen, forming gas, and sulfur hexafluoride. Carbon dioxide is particularly preferred.

Fluoro species usefully employed in the broad practice of the invention include, without limitation, hydrogen fluoride (HF), ammonium fluoride ($NH_4F$), alkyl hydrogen fluoride ($NRH_3F$), dialkylammonium hydrogen fluoride ($NR_2H_2F$), trialkylammonium hydrogen fluoride ($NR_3HF$), trialkylammonium trihydrogen fluoride ($NR_3(3HF)$), tetraalkylammonium fluoride ($NR_4F$), and xenon difluoride ($XeF_2$), wherein each R in the aforementioned R-substituted species is independently selected from $C_1$–$C_8$ alkyl and $C_6$–$C_{10}$ aryl. Triethylamine trihydrogen fluoride is a preferred fluoro species due to its mild fluorination properties and favorable solubility in $CO_2$ when supercritical carbon dioxide $SCCO_2$ is employed as the SCF species. Ammonium fluoride is another preferred fluoro species, e.g., in compositions containing co-solvent media, due to its low toxicity and ease of handling, as well as the acid-base buffering action associated with the ammonia-HF combination.

Co-solvent species useful in the cleaning compositions of the invention may be of any suitable type, including alcohols, amides, ketones, esters, etc. Illustrative species include, but are not limited to, methanol, ethanol, and higher alcohols, N-alkylpyrrolidones or N-arylpyrrolidones, such as N-methyl-, N-octyl-, or N-phenyl-pyrrolidones, dimethylsulfoxide, sulfolane, catechol, ethyl lactate, acetone, butyl carbitol, monoethanolamine, butyrol lactone, diglycol amine, γ-butyrolactone, butylene carbonate, ethylene carbonate, and propylene carbonate: Alcohols such as methanol, ethanol and isopropyl alcohol (IPA) are especially preferred.

Inhibitor additives may be used in the compositions of the invention to inhibit attack of the cleaning composition on low dielectric constant layers. Inhibitor species such as organic acids and/or inorganic acids are usefully employed for such purpose. Boric acid is a particularly preferred species.

The relative proportions of the above-described ingredients of the cleaning compositions of the invention can be widely varied to achieve a desired solvating and removal effect in application to photoresist and post-ashing residue removal from semiconductor wafers.

In general the SCF species comprises a substantial major fraction of the cleaning composition, typically constituting from about 75% by weight, based on the weight of the cleaning composition, to about 99.9% by weight, on the same cleaning composition weight basis. The fluoro species can be present in a suitable amount in relation to the SCF species, and amounts of from about 0.01% by weight to about 5% by weight, based on the weight of the cleaning composition, are usefully employed in specific embodiments of the invention. Low k material attack-inhibitors may optionally be present in an amount of up to about 5% by weight, based on the total weight of the composition. Co-solvent species may optionally be employed in the compositions of the invention, at concentrations of up to about 25% by weight, based on the total weight of the composition, when employed to increase solubility of the fluoro species in the particular SCF species employed. Surfactants may optionally be utilized in compositions of the invention at concentrations of up to 5% by weight, based on the weight of the cleaning composition. In the compositions including such species, the total weight percent of all ingredients is 100%.

In a specific illustrative embodiment, the cleaning composition has the following formulation, wherein all percentages are by weight:
  a. Carbon dioxide: 80–99.01% (w/w)
  b. Fluoride species: 0.01–5.0% (w/w)
  c. Low-k material attack inhibitor: 0.0–5.0% (w/w)
  d. Co-solvent: 0–20% (w/w)
  e. TOTAL: 100% by weight In another specific illustrative embodiment, the cleaning composition has the following formulation, wherein all percentages are by weight:
  a. Carbon dioxide: 80–99% (w/w)
  b. Fluoride species: 0.01–5.0% (w/w)
  c. Co-solvent: 1–20% (w/w)
  d. Surfactant: 0.0–5.0% (w/w)
  e. TOTAL: 100% by weight The pressure of the cleaning composition can be in a range of from about 800 to about 10,000 psi, e.g., about 4000 psi, with temperature of the composition being in a range of from about 20 to about 150° C., and more preferably in a range of from about 40 to about 100° C., e.g., a temperature of about 50 to about 80° C.

In an illustrative cleaning process according to the present invention, in one embodiment thereof, the substrate (wafer) to be cleaned is placed in a sealed high-pressure chamber. The chamber then is filled with the cleaning composition of the invention, and the substrate is held under the cleaning solution for a predetermined time, at predetermined pressure and temperature, as appropriate to effect the desired cleaning of the substrate. The specific contact time of the cleaning composition with the substrate, and process (e.g., temperature and pressure) conditions can be readily determined by simple ex periment, based on the disclosure herein, within the skill of the art.

After the substrate has been subjected to the cleaning composition for sufficient time and at sufficient processing conditions, the substrate may be rinsed with a solution containing only the SCF species, or alternatively containing only the SCF species and optional co-solvent(s), in order to remove the residue and the fluoro species. After rinsing for a sufficient time to effect appropriate removal of the residue and fluoro species, the cleaning chamber may be vented and the substrate may be removed. Appropriate rinsing conditions can readily be determined within the skill of the art, based on the disclosure herein, to achieve a specific removal character and extent.

In another aspect, the invention provides wafer cleaning compositions utilizing supercritical fluid (SCF) in combination with primary and/or secondary amine(s).

Such cleaning compositions, utilizing primary and/or secondary amine(s) in the SCF-based cleaning composition, optionally in combination with co-solvent(s), inhibitor(s) and/or surfactant(s), are advantageous for cleaning of photoresists, anti-reflective coatings, metal oxides and/or metal-containing residues that are present on the semiconductor wafer after plasma etching or ashing.

In such amine-containing SCF cleaning compositions, co-solvent(s) and/or surfactant(s) are optionally employed to enhance the compatibility of the primary and/or secondary amine(s) with the SCF in the composition. The composition can comprise from about 75% to about 99.9% by weight, based on the weight of the cleaning composition, of the SCF, from about 0.01% to about 5.0% by weight of the primary and/or secondary amine(s), from about 0% to about 25% by weight of co-solvent(s), and up to about 5% by weight of surfactant(s), on the same total composition weight basis, with all ingredients of the composition totaling to 100 weight %. Compositions of such type may further optionally comprise inhibitor species to suppress attack on low k materials that may be present on the wafer being cleaned.

Particularly preferred amine-containing SCF cleaning compositions of above-described type include from about 80 to about 99.9% by weight of $SCCO_2$, from about 0.01% to about 5.0% by weight of primary or secondary amine, from about 0% to about 20% by weight of co-solvent, and up to 5% by weight of surfactant, with all ingredient weight percentages being based on the total weight of the composition, and with all weight percentage amounts of such ingredients totaling to 100 weight %.

The SCF in such composition can suitably include any of the illustrative SCF species described hereinabove. $SCCO_2$ is a particularly preferred SCF species for such purpose. Suitable amines include, without limitation, hydroxylamine ($NH_2OH$), ammonia ($NH_3$), alkylamines ($R—NH_2$) and dialkylamines ($R_1R_2NH$), wherein R, $R_1$ and $R_2$ are each independently selected from $C_1$–$C_8$ alkyl and $C_6$–$C_{10}$ aryl.

Co-solvents can be of any suitable type, including alcohols, amides, ketones, esters, lactones, 1,3-diones, etc., with alcohols such as isopropyl alcohol (IPA) being particularly preferred. Surfactants likewise can be of any suitable type, preferably including a non-ionic surfactant such as the non-ionic surfactants commercially available from Air Products & Chemicals, Inc. under the trademark Surfynol®. Inhibitor(s), when used, can be of a type as previously described in connection with fluoro species-containing SCF cleaning compositions of the invention.

Amine-containing SCF cleaning compositions of the invention can be deployed for cleaning at any appropriate supercritical fluid conditions of temperature and pressure. Typically, such compositions are utilized at pressure in a range of from about 800 and about 10,000 psi, e.g., about 4000 psi, and temperature in a range of from about 20 to about 150° C., e.g., and more preferably from about 40 to about 100° C. Specific process conditions of temperature and pressure are readily determinable within the skill of the art based on the disclosure herein, by simple formulation, varying of process conditions, and determination of the nature and extent of cleaning thereby achieved, in a particular application of the cleaning composition.

The features and advantages of the invention are more fully illustrated by the following non-limiting examples.

FIG. 1 is a scanning electron microscope (SEM) micrograph of a post-ashing trench structure in a two-layer coating on a silicon substrate, wherein the two-layer coating includes a first (lower) layer of low k dielectric material and a second (upper) layer of a capping dielectric material, before cleaning.

Figure 2:
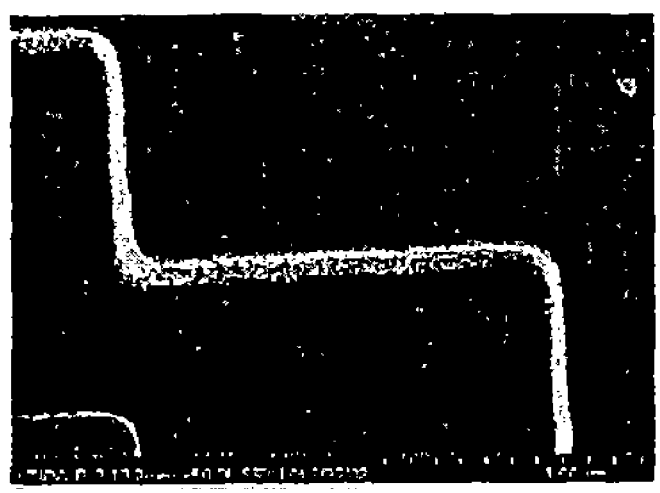
FIG. 2 is an SEM micrograph of the trench structure of FIG. 1, after washing with a cleaning composition comprising $SCCO_2$, ethanol, $(C_2H_5)_3N(3HF)$ and boric acid.

FIG. 2 is an SEM micrograph of the trench structure of FIG. 1, after washing with a cleaning composition in accordance with one embodiment of the present invention. In FIG. 1, the post-ashing residue is visible as a continuous wall covering the trench sidewall. FIG. 2 shows the same trench structure after cleaning for approximately 2 minutes with a composition comprising a mixture of about 10% by weight ethanol solution in $SCCO_2$, wherein the ethanol solution comprises about 0.5 wt % $(C_2H_5)_3N(3HF)$ and about 0.25 weight % boric acid. A rinsing step follows after the cleaning step where the trench structure is rinsed in $SCCO_2$ solvent for approximately 5 minutes. Advantageously, the post-ashing (oxidizing or reducing) sidewall residue has been removed, without attack on the dielectric materials of the structure. Process conditions utilized in such embodiment include pressure, temperature and flow rate of approximately 4000 psi, 50° C. and 50 mL/min., respectively.

FIGS. 3A and 3B are scanning electron microscope (SEM) micrographs of a post-ashing trench structure in a two-layer coating on a silicon substrate, wherein the two-layer coating includes a first (lower) layer of low k dielectric material and a second (upper) layer of a capping dielectric material, before cleaning.

FIG. 4 is an SEM micrograph of the trench structure in the two-layer coating on the silicon substrate of FIGS. 3A and 3B, after washing with a cleaning composition in accordance with a further embodiment of the present invention. FIG. 4 shows the same trench structure after cleaning for approximately 2 minutes with a composition comprising a mixture of about 10% by weight isopropanol solution in $SCCO_2$, wherein the isopropanol solution comprises about 0.5 wt % $NHF_4$, about 0.25 wt % boric acid, and 0.5 wt % surfactant. A rinsing step follows after the cleaning step where the trench structure is rinsed in $SCCO_2$ solvent for approximately 5 minutes. Process conditions utilized in such embodiment include pressure, temperature and flow rate of approximately 4000 psi, 50° C. and 50 mL/min., respectively.

Post-ash residue is clearly visible on the surface of the wafer in FIGS. 3A and 3B. FIG. 4 shows that after cleaning the post-ash residue has been removed, with some etching of the dielectric materials. An undercut is visible, which is due to faster etching of the lower (low k) dielectric material.

The micrographs of FIGS. 1–4 thus evidence the efficacy of the cleaning compositions of the invention, for high efficiency cleaning of post-ashing residue on semiconductor wafers.

While the invention has been described herein in reference to specific aspects, features and illustrative embodiments of the invention, it will be appreciated that the utility of the invention is not thus limited, but rather extends to and encompasses numerous other aspects, features and embodiments. Accordingly, the claims hereafter set forth are intended to be correspondingly broadly construed, as including all such aspects, features and embodiments, within their spirit and scope.

What is claimed is:

1. A composition for cleaning semiconductor wafers, wherein the composition includes supercritical fluid, at least one fluoro species, and an inhibitor that is effective to inhibit attack of the cleaning composition on low dielectric constant layer material, wherein said inhibitor comprises boric acid.

2. The composition of claim 1, wherein the supercritical fluid comprises a supercritical fluid species selected from the group consisting of carbon dioxide, oxygen, argon, krypton, xenon, ammonia, methane, methanol, dimethyl ketone, hydrogen, forming gas, and sulfur hexafluoride.

3. The composition of claim 1, wherein the supercritical fluid comprises carbon dioxide.

4. The composition of claim 1, wherein the fluoro species comprises a fluorine-containing material selected from the group consisting of hydrogen fluoride (HF), ammonium fluoride ($NH_4F$), alkyl hydrogen fluoride ($NRH_3F$), dialkylammonium hydrogen fluoride ($NR_2H_2F$), trialkylammonium hydrogen fluoride ($NR_3HF$), trialkylammonium trihydrogen fluoride ($NR_3(3HF)$), tetraalkylammonium fluoride ($NR_4F$), and xenon difluoride ($XeF_2$), wherein each R is independently selected from $C_1$–$C_8$ alkyl and $C_6$–$C_{10}$ aryl.

5. The composition of claim 1, wherein the fluoro species comprises triethylamine trihydrogen fluoride.

6. The composition of claim 1, wherein the fluoro species comprises ammonium fluoride.

7. The composition of claim 1, further comprising co-solvent.

8. The composition of claim 7, wherein the co-solvent comprises at least one solvent species selected from the group consisting of alcohols, amides, ketones, and esters.

9. The composition of claim 7, wherein the co-solvent comprises at least one solvent species selected from the group consisting of alcohols, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, γ-butyrolactone, butylene carbonate, ethylene carbonate, and propylene carbonate, wherein alkyl is $C_1$–$C_8$ alkyl and aryl is $C_6$–$C_{10}$ aryl.

10. The composition of claim 7, wherein the co-solvent comprises at least one alcohol.

11. The composition of claim 7, wherein the co-solvent comprises at least one solvent species selected from the group consisting of methanol, ethanol, and isopropyl alcohol.

12. The composition of claim 7, wherein the co-solvent comprises at least one solvent species selected from the group consisting of N-methyl-, N-octyl-, and N-phenyl-pyrrolidones.

13. The composition of claim 7, wherein the co-solvent comprises at least one solvent species selected from the group consisting of ethanol and isopropyl alcohol.

14. The composition of claim 1, wherein the supercritical fluid species comprises a substantial major fraction of the cleaning composition.

15. The composition of claim 1, wherein the supercritical fluid species is present in an amount of from about 75% by weight to about 99.01% by weight, based on the total weight of the composition.

16. The composition of claim 1, wherein the supercritical fluid species is present in an amount of from about 80% by weight to about 99.01% by weight, based on the total weight of the composition.

17. The composition of claim 1, wherein the fluoro species is present in an amount of from about 0.01% by weight to about 5% by weight, based on the total weight of the composition.

18. The composition of claim 1, wherein the inhibitor is present in an amount of up to about 5% by weight, based on the total weight of the composition.

19. The composition of claim 7, wherein the co-solvent is present in an amount of up to about 25% by weight, based on the total weight of the composition.

20. The composition of claim 7, wherein the co-solvent is present in an amount of up to about 20% by weight, based on the total weight of the composition.

21. The composition of claim 7, wherein the co-solvent is present in an amount of from about 1% to about 20% by weight, based on the total weight of the composition.

22. The composition of claim 1, having the following formulation, wherein all percentages are by weight:
   Carbon dioxide: 80–99.01% (w/w)
   Fluoride species: 0.01–5.0% (w/w)
   Low-k material attack inhibitor: up to 5.0% (w/w)
   Co-solvent: 0–20% (w/w)
   TOTAL: 100% by weight.

23. The composition of claim 1, having the following formulation, wherein all percentages are by weight:
   Carbon dioxide: 80–99% (w/w)
   Fluoride species: 0.01–5.0% (w/w)
   Co-solvent: 1–20% (w/w)
   Low-k material attack inhibitor: up to 5.0% (w/w)
   Surfactant: 0.0–5.0% (w/w)
   TOTAL: 100% by weight.

24. A composition for cleaning semiconductor wafers, wherein the composition includes supercritical fluid, at least one primary and/or secondary amine(s), and at least one surfactant, wherein the primary and/or secondary amine(s) include at least one amine species selected from the group consisting of hydroxylamine ($NH_2OH$), ammonia ($NH_3$), alkylamines (R—$NH_2$) and dialkylamines ($R_1R_2NH$), wherein R, $R_1$ and $R_2$ are each independently selected from $C_1$–$C_6$ alkyl and aryl.

25. The composition of claim 24, further comprising co-solvent.

26. The composition of claim 24, further comprising an inhibitor that is effective to inhibit attack of the cleaning composition on low dielectric constant layer material.

27. The composition of claim 24, wherein the supercritical fluid is present in an amount of from about 75% by weight to about 99.01% by weight, based on the total weight of the composition.

28. The composition of claim 24, wherein the supercritical fluid is present in an amount of from about 80% by weight to about 99% by weight, based on the total weight of the composition.

29. The composition of claim 24, comprising from about 0.01% to about 5.0% by weight of the primary and/or secondary amine(s), based on the total weight of the composition.

30. The composition of claim 25, comprising from about 1% to about 25% by weight of co-solvent, based on the total weight of the composition.

31. The composition of claim 25, comprising from about 1% to about 20% by weight of co-solvent, based on the total weight of the composition.

32. The composition of claim 24, comprising up to about 5% by weight of surfactant, based on the total weight of the composition.

33. The composition of claim 24, comprising from about 80 to about 99.91% by weight of $SCCO_2$, from about 0.01% to about 5.0% by weight of primary and/or secondary amine, from about 1% to about 20% by weight of co-solvent, and up to 5% by weight of surfactant, with all ingredient weight percentages being based on the total weight of the composition, and with all weight percentage amounts of such ingredients totaling to 100 weight %.

34. The composition of claim 24, wherein the supercritical fluid comprises a fluid species selected from the group consisting of carbon dioxide, oxygen, argon, krypton, xenon, ammonia, methane, methanol, dimethyl ketone, hydrogen, forming gas, and sulfur hexafluoride.

35. The composition of claim 24, wherein the supercritical fluid comprises carbon dioxide.

36. The composition of claim 25, wherein the co-solvent comprises at least one solvent species selected from the group consisting of alcohols, amides, ketones, esters, lactones, and 1,3-diones.

37. The composition of claim 25, wherein the co-solvent comprises isopropyl alcohol.

38. The composition of claim 24, wherein the surfactant comprises a non-ionic surfactant.

39. The composition of claim 1, at pressure in a range of from about 800 to about 10,000 psi.

40. The composition of claim 39, at temperature in a range of from about 20 to about 150° C.

41. The composition of claim 39, at temperature in a range of from about 40 to about 100° C.

42. The composition of claim 39, at temperature in a range of from about 75 to about 80° C.

43. A method of cleaning of a semiconductor wafer, comprising contacting the semiconductor wafer with a supercritical fluid-based cleaning composition including supercritical fluid, at least one fluoro species, and an inhibitor that is effective to inhibit attack of the cleaning composition on low dielectric constant layer material, wherein said inhibitor comprises boric acid.

44. The method of claim 43, wherein the supercritical fluid comprises a supercritical fluid species selected from the group consisting of carbon dioxide, oxygen, argon, krypton, xenon, ammonia, methane, methanol, dimethyl ketone, hydrogen, forming gas, and sulfur hexafluoride.

45. The method of claim 43, wherein the supercritical fluid comprises carbon dioxide.

46. The method of claim 43, wherein the fluoro species comprises a fluorine-containing material selected from the group consisting of hydrogen fluoride (HF), ammonium fluoride ($NH_4F$), alkyl hydrogen fluoride ($NRH_3F$), dialkylammonium hydrogen fluoride ($NR_2H_2F$), trialkylammonium hydrogen fluoride ($NR_3HF$), trialkylammonium trihydrogen fluoride ($NR_3(3HF)$), tetraalkylammonium fluoride ($NR_4F$), and xenon difluoride ($XeF_2$), wherein each R is independently selected from $C_1$–$C_8$ alkyl and $C_6$–$C_{10}$ aryl.

47. The method of claim 43, wherein the fluoro species comprises triethylamine trihydrogen fluoride.

48. The method of claim 43, wherein the fluoro species comprises ammonium fluoride.

49. The method of claim 43, wherein the composition further comprises co-solvent.

50. The method of claim 49, wherein the co-solvent comprises at least one solvent species selected from the group consisting of alcohols, amides, ketones, and esters.

51. The method of claim 49, wherein the co-solvent comprises at least one solvent species selected from the group consisting of alcohols, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, γ-butyrolactone, butylene carbonate, ethylene carbonate, and propylene carbonate, wherein alkyl is $C_1$–$C_8$ alkyl and aryl is $C_6$–$C_{10}$ aryl.

52. The method of claim 49, wherein the co-solvent comprises at least one alcohol.

53. The method of claim 49, wherein the co-solvent comprises at least one solvent species selected from the group consisting of methanol, ethanol, and isopropyl alcohol.

54. The method of claim 49, wherein the co-solvent comprises at least one solvent species selected from the group consisting of N-methyl-, N-octyl-, and N-phenylpyrrolidones.

55. The method of claim 49, wherein the co-solvent comprises at least one solvent species selected from the group consisting of ethanol and isopropyl alcohol.

56. The method of claim 43, wherein the supercritical fluid species comprises a substantial major fraction of the cleaning composition.

57. The method of claim 43, wherein the supercritical fluid species is present in the composition in an amount of from about 75% by weight to about 99.01% by weight, based on the total weight of the composition.

58. The method of claim 43, wherein the supercritical fluid species is present in an amount of from about 80% by weight to about 99.01% by weight, based on the total weight of the composition.

59. The method of claim 43, wherein the fluoro species is present in an amount of from about 0.01% by weight to about 5% by weight, based on the total weight of the composition.

60. The method of claim 43, wherein the inhibitor is present in an amount of up to about 5% by weight, based on the total weight of the composition.

61. The method of claim 49, wherein the co-solvent is present in an amount of up to about 25% by weight, based on the total weight of the composition.

62. The method of claim 49, wherein the co-solvent is present in an amount of up to about 20% by weight, based on the total weight of the composition.

63. The method of claim 49, wherein the co-solvent is present in an amount of from about 1% to about 20% by weight, based on the total weight of the composition.

64. The method of claim 43, wherein the composition has the following formulation, wherein all percentages are by weight:
Carbon dioxide: 80–99.01% (w/w)
Fluoride species: 0.01–5.0% (w/w)
Low-k material attack inhibitor: up to 5.0% (w/w)

Surfactant: up to 5.0% (w/w)
Co-solvent: 0–20% (w/w)
TOTAL: 100% by weight.

65. The method of claim 43, wherein the composition has the following formulation, wherein all percentages are by weight:
Carbon dioxide: 80–99% (w/w)
Fluoride species: 0.01–5.0% (w/w)
Co-solvent: 1–20% (w/w)
Surfactant: up to 5.0% (w/w)
TOTAL: 100% by weight.

66. A method of cleaning of a semiconductor wafer, comprising contacting the semiconductor wafer with a supercritical fluid-based cleaning composition including supercritical fluid, at least one primary and/or secondary amine(s), and at least one surfactant, wherein the primary and/or secondary amine(s) include at least one amine species selected from the group consisting of hydroxylamine ($NH_2OH$), ammonia ($NH_3$), alkylamines ($R-NH_2$) and dialkylamines ($R_1R_2NH$), wherein R, $R_1$ and $R_2$ are each independently selected from $C_1$–$C_6$ alkyl and $C_6$ aryl.

67. The method of claim 66, wherein the composition further comprises co-solvent.

68. The method of claim 66, wherein the composition further comprises an inhibitor that is effective to inhibit attack of the cleaning composition on low dielectric constant layer material.

69. The method of claim 68, wherein the inhibitor comprises boric acid.

70. The method of claim 66, wherein the supercritical fluid is present in the composition in an amount of from about 75% by weight to about 99.01% by weight, based on the total weight of the composition.

71. The method of claim 66, wherein the supercritical fluid is present in the composition in an amount of from about 80% by weight to about 99% by weight, based on the total weight of the composition.

72. The method of claim 66, wherein the composition comprises from about 0.01% to about 5.0% by weight of the primary and/or secondary amine(s), based on the total weight of the composition.

73. The method of claim 67, wherein the composition comprises from about 1% to about 25% by weight of co-solvent, based on the total weight of the composition.

74. The method of claim 67, wherein the composition comprises from about 1% to about 20% by weight of co-solvent, based on the total weight of the composition.

75. The method of claim 66, wherein the composition comprises up to about 5% by weight of surfactant, based on the total weight of the composition.

76. The method of claim 67, wherein the composition comprises from about 80 to about 99.01% by weight of $SCCO_2$, from about 0.01% to about 5.0% by weight of primary and/or secondary amine, from about 1% to about 20% by weight of co-solvent, and up to 5% by weight of surfactant, with all ingredient weight percentages being based on the total weight of the composition, and with all weight percentage amounts of such ingredients totaling to 100 weight %.

77. The method of claim 66, wherein the supercritical fluid comprises a fluid species selected from the group consisting of carbon dioxide, oxygen, argon, krypton, xenon, ammonia, methane, methanol, dimethyl ketone, hydrogen, forming gas, and sulfur hexafluoride.

78. The method of claim 66, wherein the supercritical fluid comprises carbon dioxide.

79. The method of claim 67, wherein the co-solvent comprises at least one solvent species selected from the group consisting of alcohols, amides, ketones, esters, lactones, and 1,3-diones.

80. The method of claim 67, wherein the co-solvent comprises isopropyl alcohol.

81. The method of claim 66, wherein the surfactant comprises a non-ionic surfactant.

82. The method of claim 43, wherein the contacting step is carried out at pressure in a range of from about 800 to about 10,000 psi.

83. The method of claim 82, wherein the contacting step is carried out at temperature in a range of from about 20 to about 150° C.

84. The method of claim 82, wherein the contacting step is carried out at temperature in a range of from about 40 to about 100° C.

85. The method of claim 82, wherein the contacting step is carried out at temperature in a range of from about 75 to about 80° C.

86. The composition of claim 26, wherein the inhibitor comprises boric acid.

* * * * *

UNITED STATES PATENT AND TRADEMARK OFFICE
CERTIFICATE OF CORRECTION

PATENT NO. : 7,119,052 B2 Page 1 of 1
APPLICATION NO. : 10/602172
DATED : October 10, 2006
INVENTOR(S) : Michael B. Korzenski et al.

It is certified that error appears in the above-identified patent and that said Letters Patent is hereby corrected as shown below:

Column 5, line 14, "ex periment" should be --experiment--

Column 9, line 19, "99.91%" should be --99.01% --

Signed and Sealed this

Thirtieth Day of January, 2007

JON W. DUDAS
*Director of the United States Patent and Trademark Office*